(12) United States Patent
Li et al.

(10) Patent No.: US 8,462,025 B2
(45) Date of Patent: Jun. 11, 2013

(54) SIGNAL TRANSMISSION BETWEEN A CONTROLLER AND AN OPTICAL PICKUP UNIT

(75) Inventors: Eric Li, Milpitas, CA (US);
Shang-Kuan Tang, Fremont, CA (US);
Nedi Nadershahi, Simi Valley, CA (US)

(73) Assignee: SCT Technology, Ltd., Grand Cayman (KY)

( * ) Notice: Subject to any disclaimer, the term of this patent is extended or adjusted under 35 U.S.C. 154(b) by 34 days.

(21) Appl. No.: 13/350,602

(22) Filed: Jan. 13, 2012

(65) Prior Publication Data
US 2012/0182164 A1 Jul. 19, 2012

Related U.S. Application Data

(60) Provisional application No. 61/433,163, filed on Jan. 14, 2011.

(51) Int. Cl.
*H03M 5/00* (2006.01)
(52) U.S. Cl.
USPC ............... 341/58; 341/51; 341/59; 341/82; 341/83

(58) Field of Classification Search
USPC .............. 341/51, 58, 59, 82, 83, 106, 107
See application file for complete search history.

(56) References Cited

U.S. PATENT DOCUMENTS

| | | | |
|---|---|---|---|
| 8,229,303 B1* | 7/2012 | Lindsay | 398/193 |
| 2006/0270113 A1* | 11/2006 | Dan et al. | 438/118 |
| 2009/0185579 A1* | 7/2009 | Hong | 370/471 |
| 2009/0313697 A1* | 12/2009 | Suvakovic et al. | 726/22 |
| 2011/0050468 A1* | 3/2011 | Glass et al. | 341/94 |
| 2011/0075287 A1* | 3/2011 | Risso et al. | 360/31 |
| 2013/0083873 A1* | 4/2013 | Ishihara et al. | 375/341 |

\* cited by examiner

*Primary Examiner* — Linh Nguyen
(74) *Attorney, Agent, or Firm* — Fenwick & West LLP

(57) ABSTRACT

An improved transmission protocol is used to transmit a signal between two components of an electronic device. The improved transmission protocol is configured to reduce the number of simultaneous channel transitions that occur when multiple signal channels are transmitted in parallel. Reducing the number of simultaneous channel transitions is beneficial because a signal that is subject to skew, distortion, or electromagnetic interference during transmission may have a shorter settling time when fewer channels undergo a transition simultaneously. When the protocol is used to transmit a signal from a controller to an optical pickup unit in an optical data storage system, the reduced settling times allow for a higher data transmission rate.

15 Claims, 9 Drawing Sheets

| Bus Signal 403 | Control Signal 408 | Driver Current 416 | Laser Power Level 122 |
|---|---|---|---|
| 1111 | 1100 | 30 mA | PB |
| 1110 | 1111 | 160 mA | PL |
| 1101 | 1011 | 140 mA | PM |
| 1100 | 1100 | 30 mA | PB |
| 1011 | 1111 | 160 mA | PF |
| 1010 | 1000 | 10 mA | PC |
| 1001 | 1110 | 60 mA | P1 |
| 1000 | 1010 | 40 mA | PR |
| 0111 | 1111 | 160 mA | PL |
| 0110 | — | — | — |
| 0101 | 1100 | 30 mA | PB |
| 0100 | 1011 | 140 mA | PM |
| 0011 | 1000 | 10 mA | PC |
| 0010 | — | — | — |
| 0001 | 1010 | 40 mA | PR |
| 0000 | — | — | — |

SIGNAL TRANSMISSION BETWEEN A CONTROLLER AND AN OPTICAL PICKUP UNIT

CROSS REFERENCE TO RELATED APPLICATIONS

This application claims priority under 35 U.S.C. §119(e) to co-pending U.S. Provisional Application No. 61/433,163, entitled "Signal Transmission for Optical Pickup Unit," filed on Jan. 14, 2011, which is incorporated by reference in its entirety.

BACKGROUND OF THE INVENTION

1. Field of the Invention

The present invention relates generally to transmission of electronic signals between components of an electronic device, and more specifically to transmission of control signals between a controller and an optical pickup module in an optical data storage system.

2. Description of the Related Art

Figure 1:
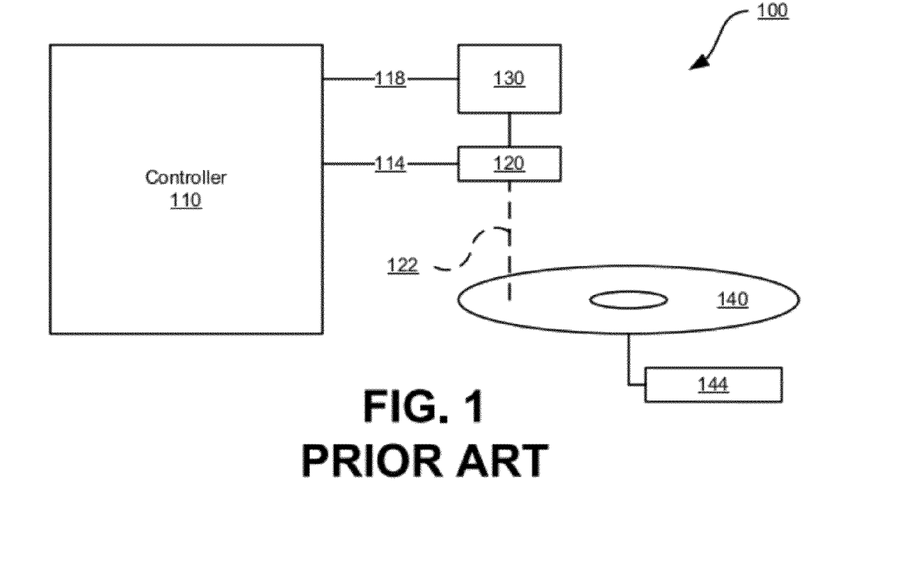
FIG. 1 is a schematic diagram illustrating components in a conventional optical data storage system.

Optical data storage systems such as compact disc (CD) devices, Digital Video Disc (DVD) devices and Blu-ray Disc devices record to and read data from optical media. Figure (FIG. 1 is a schematic diagram illustrating components in a conventional optical data storage system 100. The example optical data storage system 100 of FIG. 1 includes a controller 110, an optical pickup unit 120, an actuator unit 130, and a motor assembly 144. The controller 110 performs various signal processing (e.g., error correction, encoding and decoding) and control functions for operating the optical data storage system 100. The controller 110 is operatively connected to the optical pickup unit 120 via an interface 114 and is operatively connected to the actuator unit 130 via a different interface 118. The interfaces 114, 118 are used for communication between the controller 110 and the connected components 120, 130 and may comprise multiple signal channels operating in parallel.

The optical pickup unit 120 includes a laser source (e.g., a laser diode) and a module for driving the laser source. The laser source is used to emit a laser beam 122 onto an optical disc 140 that is rotated by the motor assembly 144. A conventional optical pickup unit 120 has two different operating modes. In a write mode, the optical pickup unit 120 receives a control signal from the controller 110 over the interface 114 and emits the beam 122 with an intensity that is determined by the control signal. In the write mode, the intensity of the beam 122 is sufficient to form patterns on the tracks of the optical disc 140. The patterns represent data stored on the optical disc 140 and can later be retrieved in a read mode. In the read mode, the optical pickup unit 120 emits the laser beam 122 and uses a sensor to detect a reflected version of the beam. The reflected version of the beam represents data that has been retrieved from the optical disc 140. The optical pickup unit 120 sends the retrieved data to the controller 110 over the interface 114 for processing.

The actuator 130 moves the optical pickup unit 120 in a radial direction relative to the optical disc 140 according to control signals received from the controller 110 via the second interface 118. In this way, the optical pickup unit 120 can read or write data on different tracks of the optical disc 140.

Figure 2:
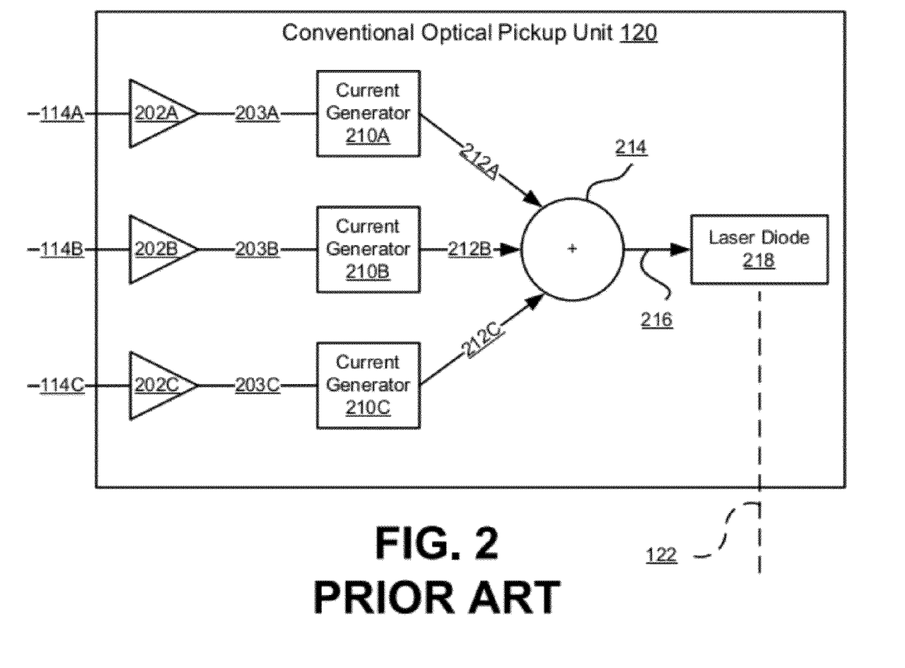
FIG. 2 is a block diagram illustrating a conventional optical pickup unit.

FIG. 2 is a block diagram illustrating an example of a conventional optical pickup unit 120. The optical pickup unit 120 may include amplifiers 202A through 202C. Each of the amplifiers 202A through 202C is connected to a signal channel 114A through 114C in the interface 114 to amplify a control signal received over the interface 114. The amplified signals 203A through 203C are sent to current generators 210 to generate output currents 212A, 212B, 212C. The components of the control signal and the corresponding amplified signals are typically binary. In other words, each amplified signal has a value of zero (0) or one (1).

When an amplified signal 203 has a value of one (1), the corresponding current generator 210 is switched on. Each current generator 210 may generate a different level of output current 212 when switched on. For example, current generator 210A may generate an output current 212A of 20 milliamperes (mA), whereas current generator 210B may generate an output current 212B of 60 mA and current generator 210C may generate an output current 212C of 10 mA. When switched off, no current is generated by the current generators 210A through 210C. A current adder 214 adds the output currents 212 to generate a driver current 216 that is provided to a laser diode 218. The laser diode 218 outputs a laser beam 122 of differing intensity based on the level of the driver current 216. As a result, the magnitude of driver current 216 and the intensity of the laser beam 122 vary depending on which of the current generators 210A through 210C are turned on or off.

Figure 3:
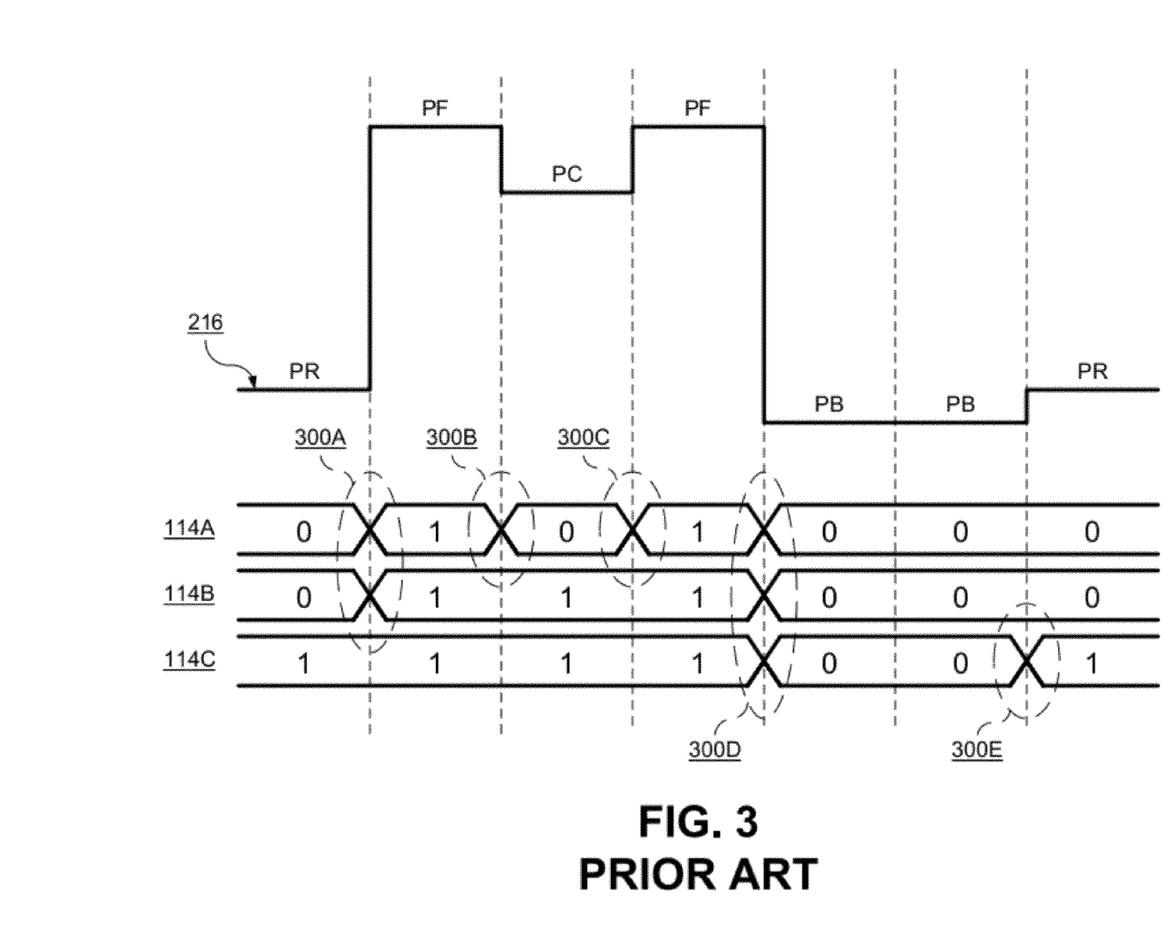
FIG. 3 is a timing diagram of a control signal transmitted over an interface in a conventional data write scheme.

FIG. 3 is a timing diagram of a driver current 216, the corresponding laser power level, and a corresponding control signal in a conventional data write scheme. A power level of the laser beam 122 is labeled with a pair of letters (e.g., PR, PF, PC, etc.), and each laser power level is generated by sending a different level of driver current 216 into the laser diode 218. A data write scheme is a sequence of power levels that is used to form a pattern on a track of the optical disc 140, thus writing data to the optical disc 140. In the data write scheme of FIG. 3, the level of the driver current 216 is varied to generate the following sequence of laser power levels: PR, PF, PC, PF, PB and PR. Each driver current level 216 is defined by a combination of active channels 114A through 114C in the control signal. For example, only channel 114C is active for the driver current level 216 corresponding to PR whereas channels 114A through 114C are active for driver current level 216 for PF. In FIG. 3, the zeros (0) represent that a channel is inactive (i.e., turned off) whereas the ones (1) represent that a channel is active (i.e., turned on). An active channel causes the corresponding current generator 210 to be switched on, thus generating the driver current 216.

As illustrated in FIG. 3, the control signal transmitted over the interface 114 undergoes a series of transitions 300 (e.g., active to inactive state and inactive to active state) to change the driver current level 216. A signal sent over the channels 114A through 114C may become skewed or distorted due to electronic noise, crosstalk, or electromagnetic interference (EMI). In particular, when one channel of the signal undergoes a transition 300 from zero to one or vice versa, the channel and the driver current 216 may take some length of time to settle, and this settling time may increase as the level of skew or distortion increases. In addition, the settling time for the driver current 216 may be longer when multiple channels of the signal undergo a transition simultaneously. For example, the transition 300C between the PC and PF current levels (e.g., when only one channel undergoes a transition) would have a shorter settling time than the transition 300D between the PF and PB current levels (e.g., when all three channels undergo a transition). To safeguard against errors that may occur during the longer settling times associated with simultaneous channel transitions, such as the transition 300D, the data transmission rate is decreased. This results in overall transmission inefficiency.

SUMMARY OF THE INVENTION

Embodiments relate to an improved transmission protocol that is used to transmit a signal between two components of an electronic device. The improved transmission protocol is configured to reduce the number of simultaneous channel transitions that occur when multiple signal channels are transmitted in parallel. When a signal is encoded and sent using the improved transfer protocol, the encoded signal is subject to shorter settling times after each transition because fewer channels are transitioned simultaneously. After the encoded signal is received at the destination component, a decoder is used to translate the encoded signal into a format that can be used to operate the destination component. As a result, it is possible to transmit the encoded signal at a higher data transmission rate than a corresponding unencoded signal while still performing the same function as the unencoded signal.

In one or more embodiments, a first component in an electronic device generates an unencoded signal consisting of a first sequence of bit patterns, and the transmission protocol is used to generate an encoded signal consisting of a second sequence of bit patterns. Each bit pattern in the second sequence is mapped to a corresponding bit pattern in the first sequence, but the transmission protocol is configured so that fewer bits are transitioned between consecutive bit patterns in the second sequence. In one embodiment, the transmission protocol may be configured so that at most one bit is transitioned between consecutive bit patterns in the second sequence. The second sequence is then transmitted over a wired connection to a second component in the electronic device. Since signals transmitted over the wired connection may be subject to electronic noise, crosstalk, or electromagnetic interference (EMI), there is a settling time after each transition between consecutive bit patterns in the second sequence. By using the transmission protocol to encode the second sequence, the settling time is reduced.

After the second component receives the second sequence of bit patterns, the second component translates the second sequence into a third sequence of bit patterns that can be used to control operation of the second component. In one embodiment, the second component of the electronic device is an optical pickup unit, and the third sequence of bit patterns controls the power level of a laser beam that is generated by a laser diode in the pickup unit. In this embodiment, the improved transmission protocol is used to reduce the number of simultaneous channel transitions in the signal that is sent to the optical pickup unit, which allows for a faster data transmission rate.

BRIEF DESCRIPTION OF THE DRAWINGS

The teachings of the present invention can be readily understood by considering the following detailed description in conjunction with the accompanying drawings.

The figures depict various embodiments of the present invention for the purposes of illustration only. One skilled in the art will readily recognize from the following discussion that alternative embodiments of the illustrated and described structures, methods, and functions may be employed without departing from the principles of the invention.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality.

Embodiments of the claimed invention establish an improved protocol for transmitting a signal over multiple signal channels between a controller and an optical pickup unit in an optical data storage system. The controller generates a bus signal and transmits the bus signal over a wired interface to the optical pickup unit. The bus signal consists of a sequence of bus bit patterns, and each bus bit pattern represents a power level of the laser beam. A signal decoder in the optical pickup unit receives the bus signal and transforms each bus bit pattern into a corresponding control bit pattern. The control bit pattern is then used as input for a series of current generators to generate a driver current that causes the laser diode to output a laser beam at the specified power level. In accordance with the improved protocol, there are fewer bit transitions between consecutive bit patterns in the bus signal than the corresponding bit patterns in the control signal. As a result, the settling time after each transition is shorter, and the data transmission rate can be increased.

In addition to the signal decoder in the optical pickup unit, a signal encoder may be added to the controller to transform a sequence of control bit patterns generated the existing controller logic into a corresponding sequence of bus bit patterns. Although not required, adding a signal encoder to the controller allows the transmission protocol to be implemented with few modifications to the existing controller logic.

A signal channel, as used herein, refers to a communication channel that is used to transmit one bit of a digital signal. For example, a three-bit signal, such as control signal received by the optical pickup unit in FIG. 2, is transmitted over three signal channels 114A, 114B, 114C of the interface 114. This allows the optical pickup unit to receive three bits of the control signal in parallel.

A bit pattern, as used herein, refers to a series of bits that are transferred in parallel over multiple signal channels as components of a signal. For example, the three-bit control signal shown in FIG. 3 has a bit pattern of one-one-one (111) between the transitions 300A and 300B (i.e., the bit pattern corresponding to a driver current level of PR). Further, a sequence of bit patterns refers to a series of bit patterns that are transmitted consecutively over the multiple signal channels. For example, a sequence of bit patterns consisting of 001, 111, 011, 111, 000, 000, and 001 is shown in FIG. 3. In this sequence, the first bit of each bit pattern is transmitted over a first signal channel 114A, the second bit is transmitted over a second signal channel 114B, and the third bit is transmitted over a third signal channel 114C.

A control signal, as used herein, refers to a signal that is used to control the intensity of the laser beam 122 in the optical pickup unit. A bit pattern for the control signal (referred to herein as a control bit pattern) determines which of the current generators in the optical pickup unit are to be active during a given cycle. As a result, the control signal directly determines the level of the driver current.

As used herein, a bus signal refers to a signal that is transmitted from the controller to the optical pickup unit. The bus signal is configured to reduce the number of signal channel transitions that occur simultaneously. As used herein, a bus bit pattern refers to a bit pattern for the bus signal.

Overview of System Architecture

Figure 4:
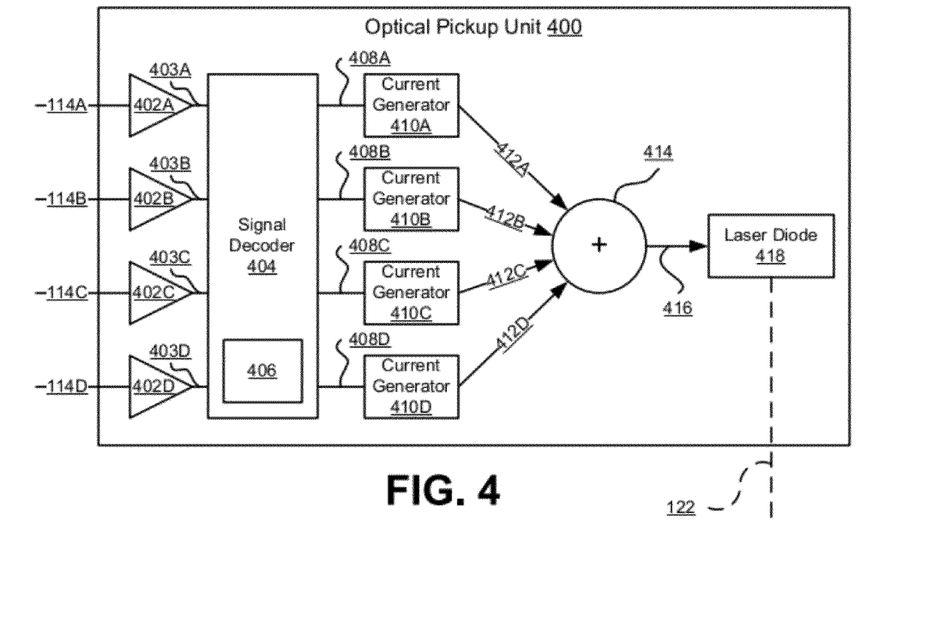
FIG. 4 is a block diagram illustrating an optical pickup unit configured to receive a bus signal encoded with the improved transmission protocol, according to one embodiment.

FIG. 4 is a block diagram illustrating an optical pickup unit 400 configured to receive a bus signal encoded with the improved transmission protocol, according to one embodiment. The optical pickup unit 400 receives a bus signal over four signal channels of an interface 114A through 114D (hereinafter collectively referred to as the "interface 114") and outputs a laser beam 122 that may be used to read or write to an optical storage medium. The intensity of the laser beam 122 varies based on the bus signal received over the interface 114. The optical pickup unit 400 may include, among other components, a series of amplifiers 402A through 402D, a signal decoder 404 with a translation table 406, current generators 410A through 410D (hereinafter collectively referred to as the "current generators 410"), a current adder 414, and a laser diode 418.

Similar to the amplifiers 202 described with reference to FIG. 2, each of the amplifiers 402 shown in FIG. 4 are connected to a signal channel of the interface 114 to amplify a channel of the bus signal received from the controller. The bus signal may be transmitted using transistor-to-transistor (TTL) signaling or differential signaling, such as low-voltage differential signaling (LVDS). Although a single line is shown for each of the signal channels of the interface 114, two signal lines may be provided for each signal channel to implement differential signaling. Unlike the control signal that is transmitted to the conventional optical pickup unit 120 of FIG. 2, however, the activation status of the bus signal channels do not correspond directly to a combination of current generators 410 that are to be switched on to produce a driver current 416. Instead, the amplified bus signals 403A through 403D (hereinafter referred to as the "amplified bus signals 403") are sent to the signal decoder 404 for conversion into control signals 408A through 408D (hereinafter collectively referred to as the "control signals 408") that can be sent to the current generators 410.

The signal decoder 404 receives the amplified bus signals 403 from the amplifiers 402 and transforms the sequence of bus bit patterns into a sequence of control bit patterns. The sequence of control bit patterns forms the control signals 408 that are used to operate the current generators 410. To perform the conversion from bus bit pattern to control bit pattern, the signal decoder 404 may include a lookup table 406 that contains mappings from bus bit patterns to corresponding control bit patterns. In one embodiment, the lookup table 406 may be programmable, so the mapping may be changed. In another embodiment, the lookup table may be hard-coded into the signal decoder, for example, as a truth table implemented with a series of logic gates.

The signal decoder 404 may also be embodied as a separate hardware unit, integrated into an existing hardware unit at the optical pickup unit 400, or as a combination of hardware, firmware, and software. For example, the signal decoder 404 may be implemented as an application-specific integrated circuit (ASIC) or a field-programmable gate array (FPGA) using methods well-known in the art.

Figure 6A:
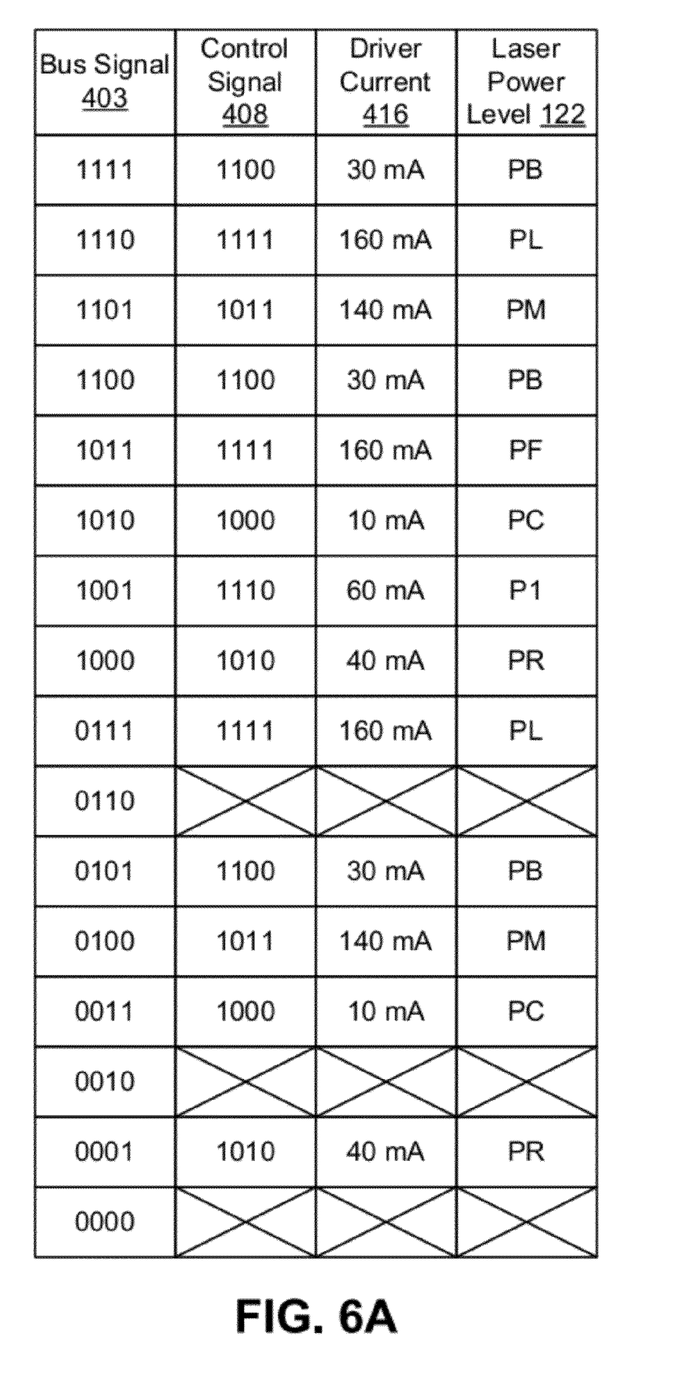
FIG. 6A is a table that illustrates relationships between bus signals, control signals, driver current levels, and laser power levels, according to one embodiment.

The mapping from bus bit patterns to control bit patterns implemented by the signal decoder 404 need not be a one-to-one mapping. If the number of possible bus bit patterns is larger than the number of current levels, then multiple bus bit patterns may be mapped to the same control signal. For example, the bus signal in FIG. 4 is received over an interface 114 that contains four signal channels, which means there are sixteen ($16=2^4$) possible bus bit patterns. If the data write schemes of the optical data storage system use a total of six different power levels, then six different control bit patterns are needed. As a result, it would be possible to map two or more bus bit patterns to the same control bit pattern. An example of this is shown in FIG. 6A. The ability to map multiple bus bit patterns to the same control bit pattern makes it easier to define a mapping in which only one bit of the bus signal changes between consecutive power levels in a set of data write schemes.

Each of the current generators 410 receive one channel of the control signals 408 from the signal decoder 404 and generate an output current 412 in the same manner as the current generators 210 described with reference to FIG. 2. In one embodiment, the four current generators 410A, 410B, 410C, 410D generate output currents 412A, 412B, 412C, 412D of 10 mA, 20 mA, 30 mA, and 100 mA, respectively, when their respective input channels have a value of one (1).

The current adder 414 receives the output currents 412 from each of the current generators 410 and adds the output currents 412 to generate the driver current 416. In the embodiment described above, the level of the driver current 416 may vary between 0 mA (control bit pattern of binary 0000) and 160 mA (control bit pattern of binary 1111). The laser diode 418 receives the driver current 416 and outputs a laser beam 122 at a power level corresponding to the level of the driver current 416.

A pair of letters may be used to notate a power level. In one embodiment, the power levels of the laser diode 418 are labeled PC, PB, PR, P1, PM, PF, PL, where PF and PL correspond to the same driver current and the same power. The correspondence between the level of the driver current 416 and the power of the laser beam 122 is described below in detail with reference to FIGS. 6A and 6B.

Figure 5:
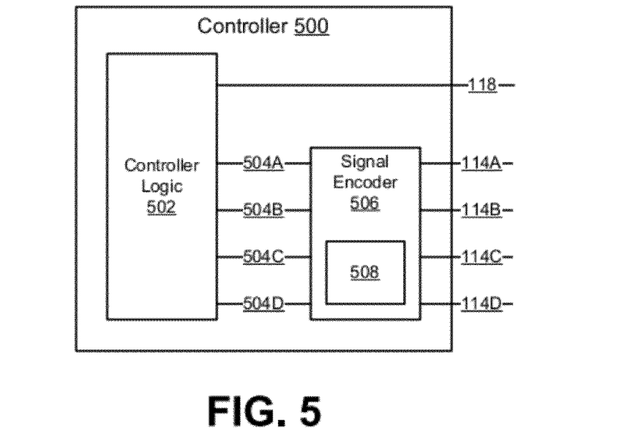
FIG. 5 is a block diagram illustrating a controller configured to transmit a bus signal encoded with the improved transmission protocol, according to one embodiment.

FIG. 5 is a block diagram illustrating a controller 500 configured to transmit a bus signal encoded with the improved transmission protocol, according to one embodiment. The controller 500 outputs signals over the interfaces 114 and 118 and may contain, among other components, the controller logic 502 and a signal encoder 506 with a translation table 508.

The controller logic 502 performs functions such as signal processing (e.g., error correction, encoding and decoding) and controlling the operation of the optical pickup unit 400. The controller logic 502 generates and outputs control signals 504A through 504D (hereinafter collectively referred to as the "control signals 504") for the optical pickup unit 400. The control signals 504 generated by the controller logic 502 may be the same as the control signals 408 used to control the current generators 410 in the optical pickup unit 400. In this case, a conventional controller 110 may be used as the controller logic 502. Although the pickup unit control signal 504 is shown in FIG. 5 as having four signal channels, the signal 504 may have a different number of signal channels in other embodiments. The controller logic 502 also generates a second control signal for the actuator, and the second control signal is sent to the actuator over a second interface 118 that may also be used to send data from the actuator back to the controller logic 502.

The signal encoder 506 receives the pickup unit control signals 504 from the controller logic 502 and transforms the control signals 504 into a bus signal for transmission to the optical pickup unit 400 over the interface 114. To perform the transformation, the signal encoder 506 may include a lookup table 508 that contains mappings from control bit patterns to bus bit patterns. If a control bit pattern is mapped to multiple bus bit patterns, such as in the example described with reference to the signal decoder 404 in FIG. 4, then the signal encoder 506 may choose which bus bit pattern is to be used to represent the control bit pattern over the interface. In this case, the signal encoder 506 is typically configured to choose a bus bit pattern that only results in a transition for one signal channel relative to the previous bus bit pattern.

The signal encoder 506 may be integrated into the controller logic 502, embodied as a separate hardware unit, or the functionality of the signal encoder 506 may be achieved through some combination of a separate hardware unit and the integrated functions of the controller logic 205. In addition, the signal encoder 506 may be embodied as a combination of hardware, firmware, and software.

After generating the bus signal, the signal encoder 506 transmits the bus signal over the interface 114 to the optical pickup unit 400. In addition to carrying the bus signal from the controller 500 to the pickup unit 400, the interface 114 is also capable of transmitting other data from the pickup unit 400 to the controller 500. Although not illustrated, the interface 114 may include additional channels to receive data, or data may be received over the four channels that are illustrated in FIG. 5 using methods well-known in the art (e.g., a multiplexer) to route the data directly to the controller logic 502 without passing through the signal encoder 506.

In alternative embodiments, the controller logic 502 may be configured to output the bus signal directly to the optical pickup unit 400 without generating a control signal 504 beforehand. In this case, the signal encoder 506 may be omitted. However, by including a signal encoder 506 in the controller 500, the controller logic of a conventional controller may be adapted for use with the improved protocol with few, if any, modifications. In other words, by using a separate signal encoder 506 to transform the control signal 504 into the bus signal, the controller logic 502 may operate in the same way as a conventional controller 110 without any consideration as to how the control signal 504 is transferred over the interface 114. Thus, the combination of the signal encoder 506 and the signal decoder 404 provide a transparent method of transmitting control signals over the interface 114 using the transmission protocol described herein.

Mapping Bus Signals to Power Levels

FIG. 6A is a table that illustrates an example of relationships between bus signals 403, control signals 408, driver currents 416, and laser power levels 122, according to one embodiment. A crossed block in the second, third, and fourth columns of a row indicate that no laser power level 122 is mapped to the bus signal 403 in the first column. As described above with reference to FIG. 4, the signal decoder 404 receives an amplified bus signal 403 and translates the bus signal 403 into a control signal 408. The control signal is used to control the current generators 410. In the embodiment of FIG. 6A, the most significant bit (i.e., the left-most bit) in the control signal 408 controls the 10 mA current generator 410A and the least significant bit (i.e., the right-most bit) controls the 100 mA current generator 410D. The current generators 410 create a series of output currents 412 that the current adder 414 combines into the driver current 416, and the driver current 416 is sent to the laser diode 418 to generate a laser beam 122 at a specified power level. The relationships shown in FIG. 6A are merely illustrative. In other embodiments, bus signals may be mapped to different power levels 122, and the bus signal or control signal 408 may contain additional or fewer signal channels.

Figure 6B:
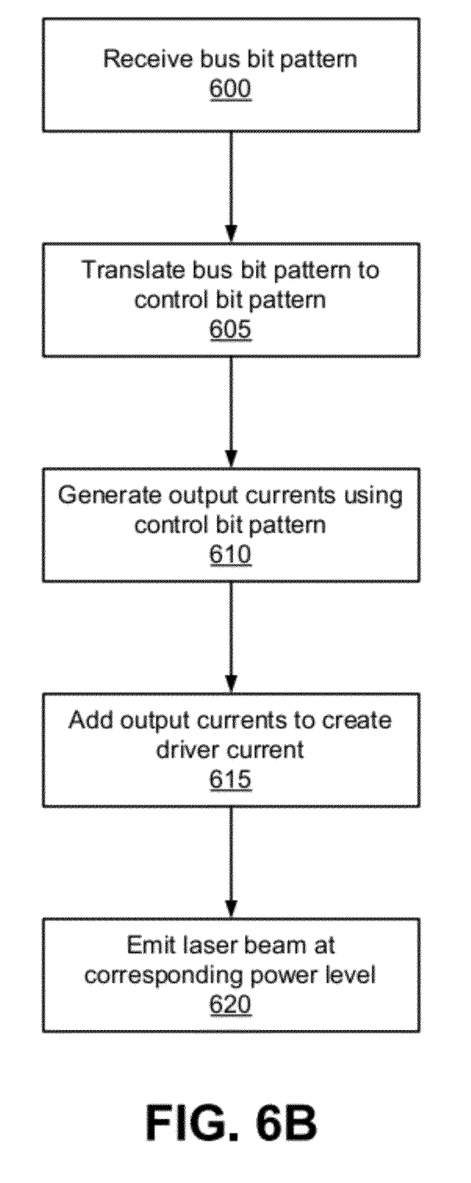
FIG. 6B is a flow chart illustrating an example process for decoding a bus signal to generate the corresponding laser power level, according to one embodiment.

FIG. 6B is a flow chart that illustrates an example process for converting the bus signal received over the interface 114 into a power level of the laser beam 122. The amplifiers 402 receive 600 a bus bit pattern over the interface 114 and generate an amplified bus bit pattern 403. The amplified bus bit pattern 403 is sent to the signal decoder 404, and the signal decoder 404 translates 605 the amplified bus bit pattern 403 into a control bit pattern 408. For example, if the bus bit pattern was binary 1111, then the signal decoder 404 would output a control bit pattern 404 of binary 1100 according to the first row of the table shown in FIG. 6A. The signal decoder 404 is used to translate the amplified bus bit pattern 403 into a corresponding control bit pattern 408 because the bus bit pattern differs from the control bit pattern. The bus bit patterns are configured to reduce the number of bit transitions that occur between consecutive bus bit patterns, whereas the control bit patterns directly control the current generators 410 that determine the power level of the laser beam.

After the signal decoder 404 generates 610 a corresponding control bit pattern 408 from the bus bit pattern 403, each signal channel of the control bit pattern 408 is used to control a corresponding current generator 410 to generate 610 a series of output currents 412. Continuing with the above example, a control bit pattern 404 of 1100 would send an input signal of one (1) to the first and second current generators 410A, 410B and an input signal of zero (0) to the third and fourth current generators 410C, 410D. As a result, the current generators 410A, 410B would output currents of 10 mA and 20 mA, respectively, whereas the current generators 401C, 410D would output currents of 0 mA.

The current adder 414 adds 615 the output currents 412 to create a driver current 416. For the example where the current adder 414 receives output currents 412 of 10 mA, 20 mA, 0 mA, and 0 mA, the driver current 416 would be 30 mA, the sum of the output currents 412. The driver current 416 is routed to the laser diode 418, which causes the laser diode 418 to emit 620 a laser beam 122 at a power level that corresponds to the level of the driver current 416. For example, the laser diode 418 emits a beam 122 at power level PB in response to a driver current 416 of 30 mA.

Examples of Data Write Schemes

Figure 7A:
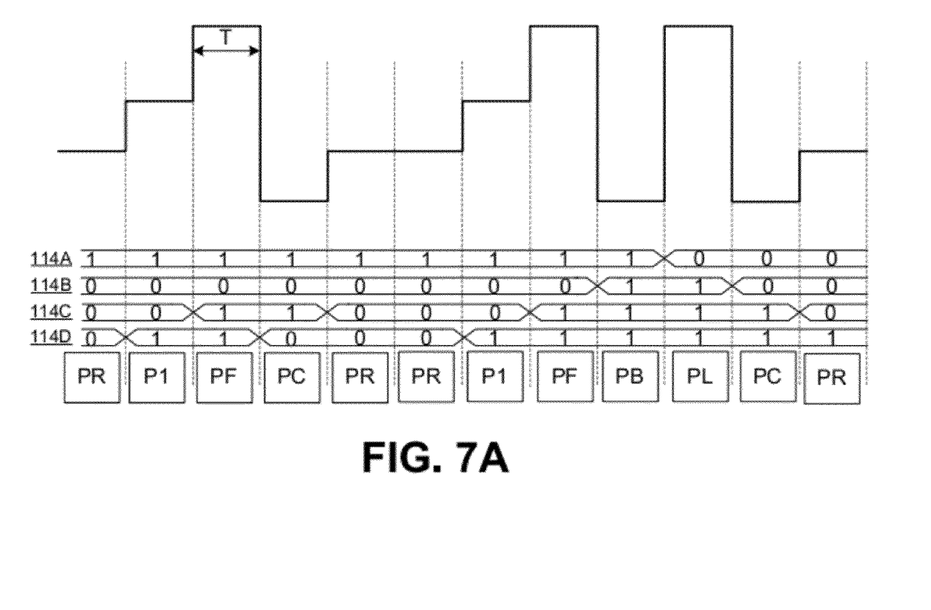
FIGS. 7A through 7D are timing diagrams for data write schemes, according to one embodiment.

FIGS. 7A through 7D are example timing diagrams, one for each of the four data write schemes used in one embodiment. As described with reference to FIG. 3, a data write scheme is a sequence of laser power levels 122 that is used to form a pattern on a track of an optical disc 140, thus writing data to the disc. FIG. 7A indicates a first write scheme where the power levels transition through the following sequence of power levels: PR, P1, PF, PC, PR, PR, P1, PF, PB, PL, PC and PR. The first write scheme is 12 cycles long, each power level persisting for a cycle T. Note that only one bit in the bus signal transitions for every power level transition. For example, during the first transition from PR (bus signal: 1000) to P1 (bus signal: 1001), only the least significant bit of the bus changes from 0 to 1. For the second transition from P1 (bus signal: 1001) to PF (bus signal: 1011), only the third bit of the bus signal changes from 0 to 1. Similarly, only a single bit changes for all other transitions in the first write scheme of FIG. 7A. It is advantageous to configure the bus signal so that only a single bit changes during each transition between bit patterns because the overall settling time of the driver current 416 and the laser power level 122 is shorter when fewer channels of the interface 114 transition simultaneously. As a result, the data transmission rate between the controller 110 and the optical pickup unit 400 is no longer constrained by the longer settling times associated with multiple simultaneous channel transitions, and the write speed of the optical data storage system may be increased.

As described above with reference to FIG. 4, the signal decoder 404 outputs a control bit pattern 408 corresponding to the bus bit pattern received over the interface 114. Taking the example of PR, the signal decoder 404 receives binary 1000 as a bus bit pattern and outputs binary 1010 as a control bit pattern. In response, the first current generator 410A and the third current generator 410C are turned on. As the bus signal transitions from one bus bit pattern to another bus bit pattern, the signal decoder 404 also switches the control bit pattern 408 that controls the current generators 410.

Figure 7B:
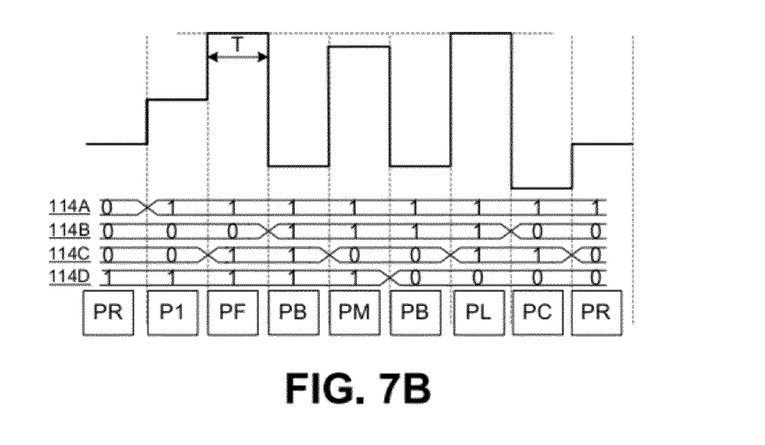

FIG. 7B indicates a second write scheme where the power levels transition through the following sequence of power levels: PR, P1, PF, PB, PM, PB, PL, PC and PR. The second write scheme is 9 cycles long, each power level persisting for a cycle T. Similar to the first write scheme, only a single bit in the bus signal changes for the transitions in the power level of the second write scheme. For example, the first transition from PR (bus signal: 0001) to P1 (bus signal: 1001) involves changing the most significant bit from 0 to 1.

Figure 7C:
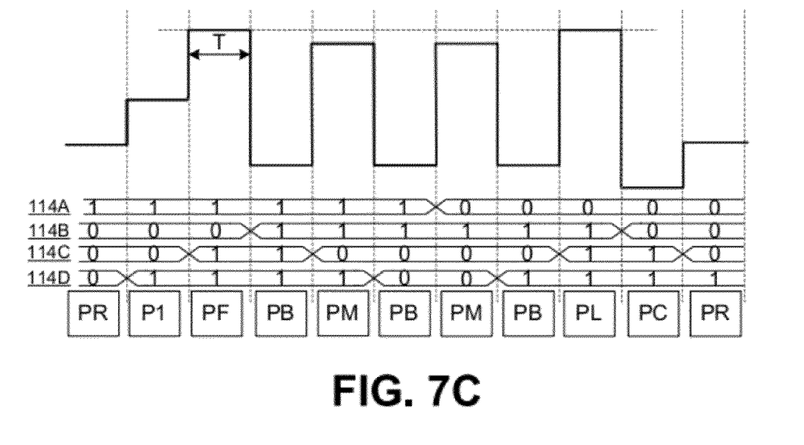

FIG. 7C indicates a third write scheme where the power levels transition through the following sequence of power levels: PR, P1, PF, PB, PM, PB, PM, PB, PL, PC and PR. The third write scheme is 11 cycles long, each power level persisting for a cycle T. Similar to the first and second write schemes, a single bit changes for all transitions in the power level of the second write scheme.

Figure 7D:
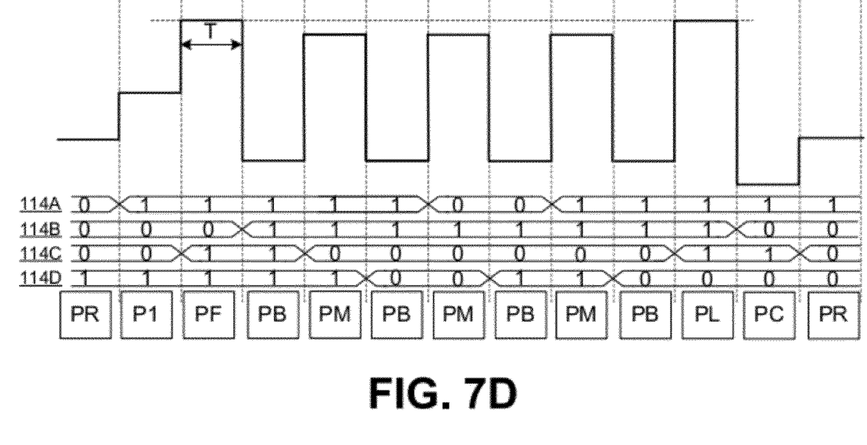

FIG. 7D indicates a fourth write scheme where the power levels transition through the following sequence of power levels: PR, P1, PF, PB, PM, PB, PM, PB, PM, PB, PL, PC and PR. The fourth write scheme is 13 cycles long, each power level persisting for a cycle T. Similar to the first, second and third write schemes, only a single bit of the bus signal changes for all transitions in the power level of the third write scheme.

The four writing schemes described above with reference to FIGS. 7A through 7D are merely illustrative. More or fewer writing schemes may be employed in an optical data storage system. Moreover, a different number of power levels and a different sequence of power levels than those illustrated in FIGS. 7A through 7D may be implemented.

Sending Control Signals Over the Improved Protocol

Figure 8:
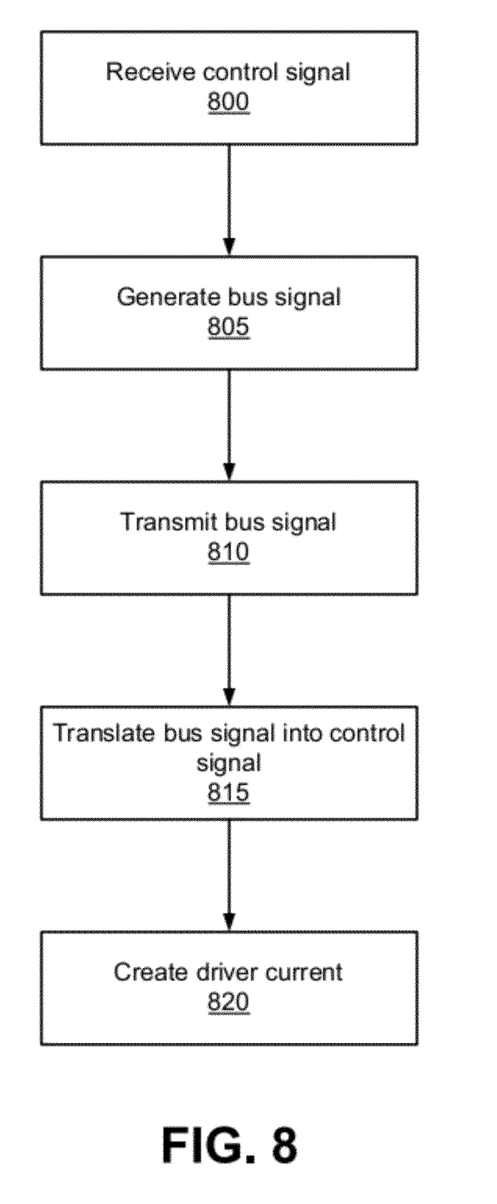
FIG. 8 is a flow chart illustrating a process for using the improved transmission protocol to transmit a control signal from a controller to an optical pickup unit, according to one embodiment.
Figure 9:
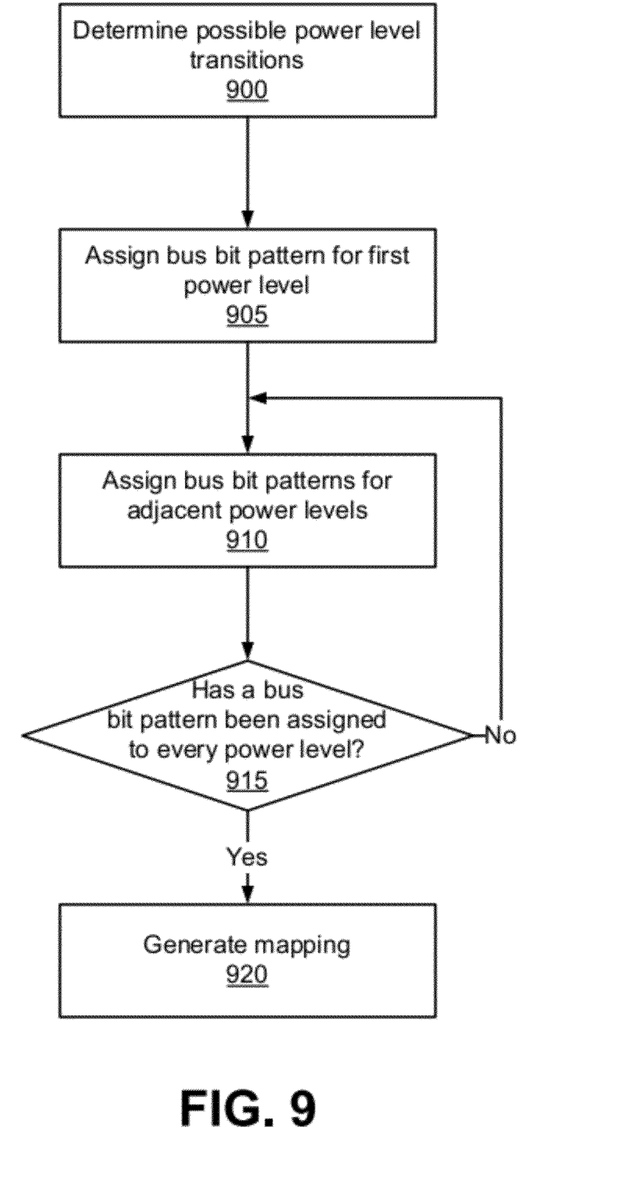
FIG. 9 is a flow chart illustrating an example process for formulating the control signal to bus signal mapping that is used in the improved transmission protocol, according to one embodiment.

FIG. 8 is a flow chart illustrating a process for using the improved transmission protocol to transmit a control signal from the controller 500 to the optical pickup unit 400, according to one embodiment. The signal encoder 506 receives 800 a control signal 504 from the controller logic 502 and generates 805 a bus signal by mapping the sequence of control bit patterns to a sequence of corresponding bus bit patterns. If there are any one-to-many mappings from a control bit pattern to multiple bus bit patterns, then the signal encoder 506 chooses a bus bit pattern that causes the fewest signal channel transitions relative to the previous bus pattern. In one embodiment, the mapping from control bit patterns to bus bit patterns is configured to ensure that there is only one channel transition between consecutive bus patterns in any data write scheme. The process described with reference to FIG. 9 is one example method of configuring the mapping in this manner.

After the signal encoder 506 generates 805 a bus signal, the bus signal is transmitted 810 to the optical pickup unit 400 over the interface 114. Similar to the control signal described with reference to FIG. 3, the bus signal may also be subject to electronic noise, crosstalk, or electromagnetic interference (EMI) when transmitted 810 over the interface 114, and channels of the bus signal may be subject to a settling time after undergoing a transition from a value of one (1) to zero (0) or vice versa. However, since the bus signal is configured to have fewer simultaneous channel transitions, the bus signal is subject to shorter settling times than the corresponding control signal. After the optical pickup unit 400 receives the bus signal over the interface 114, the bus signal is amplified and sent to the signal decoder 404, which translates 815 the bus signal back into a control signal. As described with reference to FIG. 4, the signal decoder 404 may use a lookup table 406 to translate 815 the bus signal back into the control signal.

The current generators 410 and the current adder 414 operate together to generate 820 the driver current based on the control signal generated by the signal decoder 404. As described with reference to FIGS. 4 and 6B, channels of the control signal are used to operate the current generators 410, and the current adder 414 sums the outputs 412 of the current generators to generate the driver current 416 for the laser diode 418.

Formulating the Improved Protocol

FIG. 9 is a flow chart illustrating an example process for formulating the control signal to bus signal mapping that is used in the improved transmission protocol, according to one embodiment. The process begins by compiling the data write schemes that will be used and determining 900 all possible power level transitions that will occur in the write schemes. After all possible power level transitions are determined 900, a bus signal bit pattern is assigned 905 to one of the power levels. In this first assignment, an arbitrary bus bit pattern may be assigned to an arbitrary power level. For example, a bus bit pattern of binary 1000 may be assigned to the power level PR, as shown in FIGS. 6A and 7A.

After a bus bit pattern has been assigned 905 to a first power level, a bus bit pattern is assigned 910 to power levels adjacent to the first power level. For the write schemes shown in FIGS. 7A-7D, the power levels of P1 and PC are adjacent to PR, so bus bit patterns would be assigned to those two power levels next. To assign 910 a bus bit pattern to an adjacent power level, one bit of the bus bit pattern for the first power level is flipped. For example, a bus bit pattern for power level P1 (i.e., binary 1001) was assigned by flipping the least significant bit of the bus bit pattern for power level PR (i.e., binary 1000) from zero (0) to one (1). Similarly, a bus bit pattern for power level PC (i.e., binary 1010) was assigned by flipping the third bit of binary 1000 from zero (0) to one (1).

The process continues by determining 915 whether a bus bit pattern has been assigned to every power level in each write scheme. If bus bit patterns have not been assigned to some power levels, then bus bit patterns are assigned to the power levels adjacent to the power levels that were most recently assigned bus bit patterns. For example, if bus bit patterns were most recently assigned to power levels P1 and PC, then bus bit patterns would next be assigned to the power levels adjacent to P1 and PC. In FIGS. 7A-7D, the power level PF is adjacent to P1, so a bus bit pattern would be assigned to PF. Similarly, the power level of PL is adjacent to PC, so a bus bit pattern would also be assigned to PL. During this process, more than one bus bit pattern may be assigned to the same power level to reduce the number of transitions that occur between adjacent power levels. For example, after a bus bit pattern of binary 0011 was assigned to PC in FIG. 7A, a second bus bit pattern of binary 0001 was assigned to PR. This is beneficial because there is only one signal channel transition between 0011 and 0001, whereas there would be three signal channel transitions if the previously-assigned bus bit pattern of 1000 was used for P. Although the goal of this process is to create a bus bit pattern mapping that results in only one transition in the bus signal between consecutive power levels, the process may also formulate a mapping that results in two or more transitions between some consecutive power levels if there are too many power levels or if the data write schemes are more complicated.

If the process determines that a bus bit pattern has been assigned to every power level in every data write scheme, then a mapping is generated 920 between the bus bit patterns and the control signals corresponding to the power levels. This mapping can subsequently be programmed into the lookup tables 406, 508 in the signal decoder 404 and signal encoder 508, respectively.

In alternative embodiments, a different process may be used to generate the mapping from bus bit patterns to control bit patterns. For example, instead of starting the process by determining all possible power level transitions, the process may determine all power level transitions for a first data write scheme, generate a mapping based on the first data write scheme, and extend the mapping to the other data write schemes by mapping additional bus bit patterns to power levels as needed.

Additional Considerations

Although the above examples were described with reference to data write schemes, the same principle may be employed for data read schemes where data are retrieved from an optical medium. Further, although the above examples were described with reference to bus signals transmitted between a controller 500 and an optical pickup unit 400, the transmission protocol described herein may be applied to transmission of data in other electronic devices.

Embodiments described herein reduce the number of bits transitioned simultaneously in control signals sent over an interface 114. In this way, the skew or distortion of the control signals is reduced. The reduction of skew or distortion of the control signals allow faster data transfer and improved performance of the optical data storage system.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. An electronic device comprising:
    a first component configured to:
        generate a first sequence of bit patterns, the first sequence of bit patterns configured to control operation of a second component of the electronic device;
        generate a second sequence of bit patterns mapped to the first sequence of bit patterns, wherein each bit pattern in the second sequence is mapped to a bit pattern in the first sequence, and wherein fewer bits are transitioned between each pair of adjacent bit patterns in the second sequence than between the corresponding pair of adjacent bit patterns in the first sequence; and
        transmit the second sequence of bit patterns to the second component of the electronic device over a wired connection; and
    a second component operatively connected to the first component via the wired connection and configured to:
        receive the second sequence of bit patterns from the first component of the electronic device over the wired connection;
        translate the second sequence of bit patterns into a third sequence of bit patterns, wherein each bit pattern in the second sequence is translated into a corresponding bit pattern in the third sequence, and wherein more bits are transitioned between each pair of adjacent bit patterns in the third sequence than between the corresponding pair of adjacent bit patterns in the second sequence; and
        control operation of the second component based on the third sequence of bit patterns.

2. The electronic device of claim 1, wherein the first sequence of bit patterns is identical to the third sequence of bit patterns.

3. The electronic device of claim 1, wherein at most one bit is transitioned between each pair of adjacent bit patterns in the second sequence.

4. The electronic device of claim 1, wherein the second component is configured to reference a lookup table to translate the second sequence of bit patterns into the third sequence of bit patterns, the lookup table comprising a list of mappings from a bit pattern in the second sequence to the corresponding bit pattern in the third sequence.

5. The electronic device of claim 1, wherein controlling operation of the second component comprises using each bit pattern in the third sequence to cause the second component to generate a laser beam at a power level specified by the bit pattern.

6. A first component of an electronic device, the component configured to:
    generate a first sequence of bit patterns, the first sequence of bit patterns configured to perform operation of a second component of the electronic device;
    generate a second sequence of bit patterns mapped to the first sequence of bit patterns, wherein each bit pattern in the second sequence is mapped to a bit pattern in the first sequence, and wherein fewer bits are transitioned between each pair of adjacent bit patterns in the second sequence than between the corresponding pair of adjacent bit patterns in the first sequence; and
    transmit the second sequence of bit patterns to the second component of the electronic device over a wired connection.

7. The component of claim 6, wherein at most one bit is transitioned between each pair of adjacent bit patterns in the second sequence.

8. A component of an electronic device, the component configured to:
  receive a first sequence of bit patterns;
  translate the first sequence of bit patterns into a second sequence of bit patterns, wherein each bit pattern in the first sequence is mapped to a bit pattern in the second sequence, and wherein fewer bits are transitioned between each pair of adjacent bit patterns in the first sequence than between the corresponding pair of adjacent bit patterns in the second sequence; and
  control operation of the component based on the second sequence of bit patterns.

9. The component of claim 8, wherein at most one bit is transitioned between each pair of adjacent bit patterns in the first sequence.

10. The component of claim 8, wherein the component is configured to reference a lookup table to translate the first sequence of bit patterns into the second sequence of bit patterns, the lookup table comprising a list of mappings from a bit pattern in the first sequence to the corresponding bit pattern in the second sequence.

11. The component of claim 8, wherein controlling operation of the component comprises using each bit pattern in the second sequence to cause the component to output a laser beam at a power level specified by the bit pattern.

12. A method of operating a component of an electronic device, the method comprising:
  receiving a first sequence of bit patterns;
  translating the first sequence of bit patterns into a second sequence of bit patterns, wherein each bit pattern in the first sequence is mapped to a bit pattern in the second sequence, and wherein fewer bits are transitioned between each pair of adjacent bit patterns in the first sequence than between the corresponding pair of adjacent bit patterns in the second sequence; and
  controlling operation of the component based on the second sequence of bit patterns.

13. The method of claim 12, wherein at most one bit is transitioned between each pair of adjacent bit patterns in the first sequence.

14. The method of claim 12, wherein translating the first sequence of bit patterns into the second sequence of bit patterns comprises referencing a lookup table, the lookup table comprising a list of mappings from a bit pattern in the first sequence to the corresponding bit pattern in the second sequence.

15. The method of claim 12, wherein controlling operation of the component comprises using each bit pattern in the second sequence to generate a laser beam at a power level specified by the bit pattern.

* * * * *